(12) United States Patent
Lee et al.

(10) Patent No.: US 10,679,930 B2
(45) Date of Patent: Jun. 9, 2020

(54) METAL CORE SOLDER BALL INTERCONNECTOR FAN-OUT WAFER LEVEL PACKAGE

(71) Applicant: HANA MICRON INC., Chungcheongnam-do (KR)

(72) Inventors: Hyun Woo Lee, Chungcheongnam-do (KR); Jin Wook Jeong, Chungcheongnam-do (KR); Hyun Joo Kim, Gyeonggi-do (KR); Jin Young Ock, Gyeonggi-do (KR)

(73) Assignee: HANA MICRON INC., Chungcheongnam-do (KR)

( * ) Notice: Subject to any disclaimer, the term of this patent is extended or adjusted under 35 U.S.C. 154(b) by 0 days.

(21) Appl. No.: 15/780,189

(22) PCT Filed: Nov. 28, 2016

(86) PCT No.: PCT/KR2016/013781
§ 371 (c)(1),
(2) Date: May 30, 2018

(87) PCT Pub. No.: WO2017/095094
PCT Pub. Date: Jun. 8, 2017

(65) Prior Publication Data
US 2018/0358288 A1 Dec. 13, 2018

(30) Foreign Application Priority Data

Nov. 30, 2015 (KR) .................. 10-2015-0169361
Nov. 30, 2015 (KR) .................. 10-2015-0169362

(51) Int. Cl.
*H01L 23/49* (2006.01)
*H01L 23/00* (2006.01)
(Continued)

(52) U.S. Cl.
CPC .... *H01L 23/49816* (2013.01); *H01L 21/4853* (2013.01); *H01L 21/6835* (2013.01);
(Continued)

(58) Field of Classification Search
CPC ... H01L 23/49816; H01L 23/00; H01L 23/28; H01L 23/3128; H01L 23/3185;
(Continued)

(56) References Cited

U.S. PATENT DOCUMENTS 3,809,625 A * 5/1974 Brown ............... C25D 3/56
  205/103
6,787,921 B2 * 9/2004 Huang ............... H01L 21/4853
  257/738

(Continued)

FOREIGN PATENT DOCUMENTS

JP       6133227 B2 * 5/2017 ......... H01L 23/5383
KR  10-2010-0037946     4/2010
(Continued)

OTHER PUBLICATIONS

International Search Report and Written Opinion issued in International Patent Application No. PCT/KR2016/013781, dated May 8, 2017.

*Primary Examiner* — Ida M Soward
(74) *Attorney, Agent, or Firm* — Norton Rose Fulbright US LLP

(57) ABSTRACT

A fan-out wafer level package is disclosed, which includes: a redistribution layer; a semiconductor chip electrically connected with the redistribution layer through a bump; a protective member protecting the semiconductor chip, wherein a part of the protective member is removed such that the upper surface of the semiconductor chip is exposed in order to dissipate heat and prevent warpage; and an interconnector disposed outside the semiconductor chip at
(Continued)

substantially the same level and having a lower part electrically connected with the redistribution layer and an upper part not being covered with the protective member, wherein the interconnector includes a metal core solder ball, the metal core solder ball includes a metal core and a solder buffer between the metal core and the protective member, and the metal core is formed of a combination of copper (Cu), nickel (Ni), and silver (Ag).

6 Claims, 7 Drawing Sheets

(51) Int. Cl.
| | |
|---|---|
| *H01L 23/28* | (2006.01) |
| *H01L 23/31* | (2006.01) |
| *H01L 23/48* | (2006.01) |
| *H01L 23/538* | (2006.01) |
| *H01L 25/07* | (2006.01) |
| *H01L 25/10* | (2006.01) |
| *H01L 23/498* | (2006.01) |
| *H01L 21/683* | (2006.01) |
| *H01L 25/065* | (2006.01) |
| *H01L 25/00* | (2006.01) |
| *H01L 23/488* | (2006.01) |
| *H01L 21/48* | (2006.01) |
| *H01L 21/56* | (2006.01) |

(52) U.S. Cl.
CPC .............. *H01L 23/00* (2013.01); *H01L 23/28* (2013.01); *H01L 23/3128* (2013.01); *H01L 23/3185* (2013.01); *H01L 23/488* (2013.01); *H01L 23/5389* (2013.01); *H01L 24/16* (2013.01); *H01L 24/19* (2013.01); *H01L 24/20* (2013.01); *H01L 25/0657* (2013.01); *H01L 25/105* (2013.01); *H01L 25/50* (2013.01); *H01L 21/568* (2013.01); *H01L 23/49827* (2013.01); *H01L 23/49866* (2013.01); *H01L 25/07* (2013.01); *H01L 2221/68359* (2013.01); *H01L 2224/04105* (2013.01); *H01L 2224/12105* (2013.01); *H01L 2224/1357* (2013.01); *H01L 2224/1358* (2013.01); *H01L 2224/13575* (2013.01); *H01L 2224/13576* (2013.01); *H01L 2224/13578* (2013.01); *H01L 2224/13582* (2013.01); *H01L 2224/13583* (2013.01); *H01L 2224/13584* (2013.01); *H01L 2224/16227* (2013.01); *H01L 2224/18* (2013.01); *H01L 2224/27436* (2013.01); *H01L 2224/32145* (2013.01); *H01L 2224/32245* (2013.01); *H01L 2224/48227* (2013.01); *H01L 2224/73253* (2013.01); *H01L 2224/73267* (2013.01); *H01L 2224/81191* (2013.01); *H01L 2224/83005* (2013.01); *H01L 2224/83191* (2013.01); *H01L 2224/92244* (2013.01); *H01L 2224/94* (2013.01); *H01L 2225/0651* (2013.01); *H01L 2225/1058* (2013.01); *H01L 2924/1816* (2013.01); *H01L 2924/18162* (2013.01)

(58) Field of Classification Search
CPC ... H01L 23/488; H01L 23/5389; H01L 24/16; H01L 24/19; H01L 25/07; H01L 25/105; H01L 2224/1357; H01L 2224/13575; H01L 2224/13576; H01L 2224/13578; H01L 2224/1358; H01L 2224/13582; H01L 2224/13583; H01L 2224/13584
See application file for complete search history.

(56) References Cited

U.S. PATENT DOCUMENTS

| | | | |
|---|---|---|---|
| 7,446,419 B1* | 11/2008 | Lin | H01L 21/568 257/777 |
| 9,691,738 B2* | 6/2017 | Lim | H01L 23/3107 |
| 9,908,203 B2* | 3/2018 | Cheng | B23K 35/0244 |
| 2010/0213591 A1* | 8/2010 | Ho | H01L 23/49816 257/686 |
| 2012/0020040 A1* | 1/2012 | Lin | H01L 25/0652 361/772 |
| 2012/0280404 A1* | 11/2012 | Kwon | H01L 23/3737 257/777 |
| 2012/0299197 A1* | 11/2012 | Kwon | H01L 23/18 257/777 |
| 2013/0161776 A1 | 6/2013 | Iizuka | |
| 2013/0270700 A1* | 10/2013 | Yu | H01L 23/498 257/738 |
| 2014/0367854 A1* | 12/2014 | Zhao | H01L 24/97 |
| 2015/0014847 A1* | 1/2015 | Mohammed | H01L 23/49811 257/737 |
| 2015/0092357 A1* | 4/2015 | Yoshikawa | H01L 25/00 |
| 2016/0225748 A1* | 8/2016 | We | H01L 25/50 |
| 2017/0287865 A1* | 10/2017 | Yu | H01L 23/498 |
| 2019/0123027 A1* | 4/2019 | Yu | H01L 25/50 |

FOREIGN PATENT DOCUMENTS

| | | |
|---|---|---|
| KR | 10-2013-0082298 | 7/2013 |
| KR | 10-2014-0035803 | 3/2014 |
| KR | 10-2014-0061959 | 5/2014 |
| KR | 10-2014-0070057 | 6/2014 |
| KR | 10-2014-0086812 | 7/2014 |

\* cited by examiner

METAL CORE SOLDER BALL INTERCONNECTOR FAN-OUT WAFER LEVEL PACKAGE

CROSS-REFERENCE TO RELATED APPLICATIONS

This application is a national phase application under 35 U.S.C. § 371 of International Application No. PCT/KR2016/013781, filed Nov. 28, 2016, which claims priority to and the benefit of Korean Patent Application No. 10-2015-0169361, filed Nov. 30, 2015, and Korean Patent Application No. 10-2015-0169362, filed Nov. 30, 2015. The contents of the referenced patent applications are incorporated into the present application by reference.

FIELD OF THE DISCLOSURE

The present invention relates to a fan-out wafer-level package, in which may upper and lower packages are connected using a copper (Cu) or another metal core solder ball type interconnector, to be used for a fan-out package-on-package (PoP), and a method of manufacturing the same. The present invention relates to a fan-out wafer-level package (C2FO-WLP) structure, which provides an interconnector using a metal-core solder ball of which a shape may be easily implemented and changed and appropriately adjusted to a fine pitch by adjusting a diameter of a ball. To suppress stress between a metal core and a mold, the C2FO-WLP structure minimizes stress due to a difference in coefficient of thermal expansion (CTE) between a metal and the mold and, at the same time, prevents oxidation of the metal by the metal core coated with a solder.

In addition, the present invention relates to a method of manufacturing a C2FO-WLP, which is effective in dissipating heat of a semiconductor chip and suppressing warpage of the semiconductor chip. In a method of manufacturing a fan-out PoP, a redistribution layer (RDL) process is performed on one surface or both surfaces of a package, and molding and grinding processes are performed after a metal-core solder ball is dropped and reflowed to form an interconnector for upper and lower packages. The method adjusts a thickness of a package using back-side and top-side grinding processes for removing a carrier, easily provides a RDL process by increasing surface uniformity, and prevents a mold from remaining on the semiconductor chip using a grinding process.

DESCRIPTION OF RELATED ART

Generally, a semiconductor package has a structure in which a semiconductor chip is mounted on a printed circuit board (PCB). In particular, when a plurality of memory semiconductor chips and logic semiconductor chips are stacked on the same substrate, the overall size of the semiconductor package tends to increase. To reduce the size of the package, a package-on-package (PoP) technique of vertically stacking the semiconductor chips is provided.

However, the fan-out PoP requires a via plug configured to electrically connect upper and lower packages. Since the via plug is formed of a metal, there is a limitation in that stress caused by a difference in coefficient of thermal expansion (CTE) between molding compounds adjacent to the via plug cannot be resolved.

FIG. 1 is a cross-sectional view of a semiconductor structure in which a buffer member is interposed between a molding compound and a conductive via plug, according to the related art.

Referring to FIG. 1, a semiconductor structure 12 of the related art includes a semiconductor chip 20 located on a bottom of the structure 12, a bonding pad 22 disposed on a front surface of the semiconductor chip 20, a heat dissipation layer (not shown) bonded to a rear surface of the semiconductor chip 20, a passivation 24 formed adjacent to the bonding pad 22, a molding compound 30 surrounding sidewalls of the semiconductor chip 20, a conductive via plug 40 formed in the molding compound 30, a first interconnection unit 42 connected to one end of the via plug 40, an external circuit (not shown) connected to another end of the via plug 40, a conductive pillar 44 located on a top surface of the bonding pad 22, a second interconnection unit 46 connected to one end of the conductive pillar 44, a first dielectric 52 disposed above the semiconductor chip 20 to surround the conductive pillar 44, a second dielectric 54 configured to insulate the first and second interconnection units 42 and 46 from each other, and a third dielectric 56 disposed on the second dielectric 54.

In this case, in the above-described semiconductor structure 12, a liner 32 is interposed between the molding compound 30 and the conductive via plug 40. The liner 32 functions as a stress buffer between the molding compound 30 and the conductive via plug 40. The liner 32 has a CTE between a CTE of the molding compound 30 and a CTE of the conductive plug 40.

When heat is applied to the semiconductor structure 12, a variation in dimension of the molding compound 30 becomes larger than a variation in dimension of the conductive via plug 40. When a CTE of the molding compound 30 and a CTE of the conductive via plug 40 differ by three times or more, an internal stress is generated at an interface between the molding compound 30 and the conductive via plug 40 in the semiconductor structure 12. Thus, when the liner 32 is disposed between the molding compound 30 and the conductive plug 40, a CTE gradient is reduced over the interface.

FIG. 2 is a cross-sectional view of a PoP device in which a top packaging die is adhered to a bottom packaging die using a plurality of metal plugs, according to the related art. FIG. 3 is a cross-sectional view of the bottom packaging die of FIG. 2, in which a protective layer is further formed on a sidewall of a metal plug.

Referring to FIG. 2, a PoP device 60 includes a first packaging die 62, a second packaging die 64 connected to the first packaging die 62, a plurality of metal plugs 66 connected to the first packaging die 62, and solder joints 68 disposed on the metal plugs 66.

The first packaging die 62 may include a first substrate 70, a first die 72 adhered to the first substrate 70 in a flip-chip bond-on-trace (BOT) manner, a plurality of bumps (not shown) formed on a bottom surface of the first die 72, and solder caps (not shown) disposed on the bumps.

The second packaging die 64 may include a second substrate 74, a second die 76 disposed on the second substrate 74, and a bond pad (not shown). The solder joints 68 may be formed by connecting the solder balls to the metal plugs 66 so that the first and second packaging dies 62 and 64 may be bonded to each other.

Referring to FIG. 3, the first packaging die 62 further includes a protective layer 80. By additionally forming the protective layer 80 on sidewalls of the metal plugs 66, the protective layer 80 is interposed between the metal plugs 66 and a molding compound 82.

The protective layer 80 may be formed using an electroless process, such as an electroless nickel immersion gold (ENIG) process or an electroless nickel electroless palladium immersion gold (ENEPIG) process. The protective layer 80, for example, a copper germanium (CuGe) layer, may be formed using a chemical vapor deposition (CVD) process.

By using the protective layer 80, the metal plugs 66 may be protected from oxidation and moisture, and degradation of the metal plugs 66 may be prevented from subsequent post thermal processes such as a laser drilling process and a molding process.

As described above, the liner or protective layer is used to effectively remove stress generated between the conductive metal via plug and the molding compound. However, since additional deposition and etching processes are required to form a liner including a metal layer and/or a dielectric layer, the number of processes greatly increases and costs also increase.

In addition, since a carrier is not used or a grinding process for removing the carrier does not include a process of adjusting a thickness of the entire package even in a case where the carrier is used, the thickness of the package cannot be adjusted nor can surface uniformity be improved. For example, since a molding compound or a dielectric disposed on a semiconductor chip has a CTE, the molding compound or the dielectric itself becomes the cause of warpage of the package.

SUMMARY OF THE INVENTION

Embodiments of the present invention are directed to providing a metal-core solder ball interconnector fan-out wafer-level package (C2FO-WLP) and a method of manufacturing the same, which may not require an additional metal deposition process and etching process when a liner configured to suppress a warpage phenomenon and prevent oxidation of a via plug is formed in consideration of a difference in coefficient of thermal expansion (CTE) between the via plug and a molding compound.

Embodiments of the present invention are also directed to providing a metal-core solder ball interconnector C2FO-WLP and a method of manufacturing the same, which may freely adjust a thickness of the package and improve surface uniformity using a carrier and a grinding process, and appropriately expose a semiconductor chip or a via plug according to environments of the package.

One aspect of the present invention provides a fan-out wafer-level package including a redistribution layer, a semiconductor chip electrically connected to the redistribution layer through a bump, a protective member configured to protect the semiconductor chip and be removed to expose a top surface of the semiconductor chip to dissipate heat and prevent warpage, and an interconnector disposed outside the semiconductor chip at substantially the same level as the semiconductor chip, wherein a lower portion of the interconnector is electrically connected to the redistribution layer and an upper portion of the interconnector is not covered by the protective member. The interconnector includes a metal-core solder ball, the metal-core solder ball includes a metal core and a solder buffer interposed between the metal core and the protective member, and the metal core includes a combination of copper (Cu), nickel (Ni), or silver (Ag).

Another aspect of the present invention provides a fan-out wafer-level package including a redistribution layer, a semiconductor chip having a first surface electrically connected to the redistribution layer through a bump, a protective member configured to protect a side surface of the semiconductor chip, a heat dissipation pad adhered to a second surface of the semiconductor chip, a sacrificial pad configured to be substantially coplanar with the heat dissipation pad, and an interconnector disposed outside the semiconductor chip. A lower portion of the interconnector is connected to the redistribution layer, and an upper portion of the interconnector is connected to the sacrificial pad.

Still another aspect of the present invention provides a method of manufacturing a fan-out wafer-level package. The method includes providing a silicon sacrificial substrate, directly forming a sacrificial pad on the sacrificial substrate, mounting a metal-core solder ball interconnector on the sacrificial pad, mounting a semiconductor chip in a face-up form on the sacrificial substrate, the semiconductor chip on which a contact metal is formed, molding a protective member on the sacrificial substrate, performing a first planarization process to grind portions of a top surface of the protective member until at least the interconnector and the contact metal are exposed, forming a redistribution layer on the exposed contact metal and the exposed interconnector, and performing a second planarization process to remove at least the sacrificial substrate.

Yet another aspect of the present invention provides a method of manufacturing a fan-out wafer-level package. The method includes forming a sacrificial pad on a sacrificial substrate and, at the same time or a different time, forming a heat dissipation pad on the sacrificial substrate to be coplanar with the sacrificial pad, mounting a conductive ball on the sacrificial pad, mounting a semiconductor chip on the heat dissipation pad, molding the protective member on the sacrificial substrate, performing a first planarization process to remove the protective member until the conductive ball is exposed, forming a redistribution layer on an interconnector generated when the first planarization is performed on the conductive ball, and performing a second planarization process to remove the sacrificial substrate until the sacrificial pad and the heat dissipation pad are exposed.

The following effects can be expected from the configurations of the present invention.

It is very easy to adjust a thickness of the entire package using a back-side grinding process of a molding member.

Particularly, surface uniformity of the molding member can be enhanced using the grinding process. Thus, it is very convenient to form a redistribution layer (RDL) during an RDL process.

In addition, a thickness of a metal pad can be freely adjusted using the grinding process.

Furthermore, since a semiconductor chip is exposed to the outside due to the grinding process, the exposed semiconductor chip provides a heat dissipation effect, and an effect of fundamentally preventing a warpage phenomenon, due to a CTE difference between the semiconductor chip and the molding member, can be expected.

A metal-core solder ball is very easy to shape and can be changed into various shapes. In particular, a height of the metal-core solder ball can be freely controlled by adjusting a diameter of the metal-core solder ball.

In particular, a solder buffer reduces stress applied to an interconnector and prevents natural oxidation of the interconnector.

Unit costs of materials for a metal core and the solder buffer are inexpensive, and processes of manufacturing the metal core and the solder buffer are very simple, thus contributing directly to cost reduction and an increase in yield.

Since a silicon wafer is used as a sacrificial substrate, it is unnecessary to consider the reuse of the silicon wafer, and an additional process is not required, other than a process of forming a seed.

When the interconnector is formed using the metal-core solder ball, a size of a ball can be minimized, and a height of the interconnector can be supplemented using the metal pad. Thus, it is possible to appropriately adjust to a fine pitch due to a reduction in design rule.

DETAILED DESCRIPTION OF THE INVENTION

Figure 1:
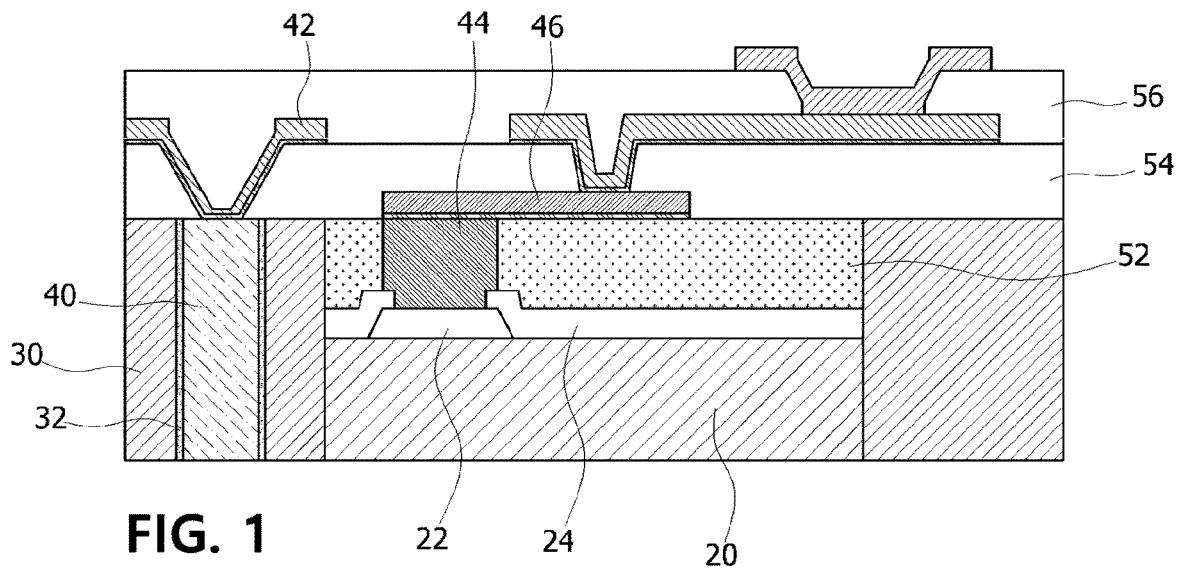
FIG. 1 is a cross-sectional view of a semiconductor structure in which a buffer member is interposed between a molding compound and a conductive via plug, according to the related art.
Figure 2:
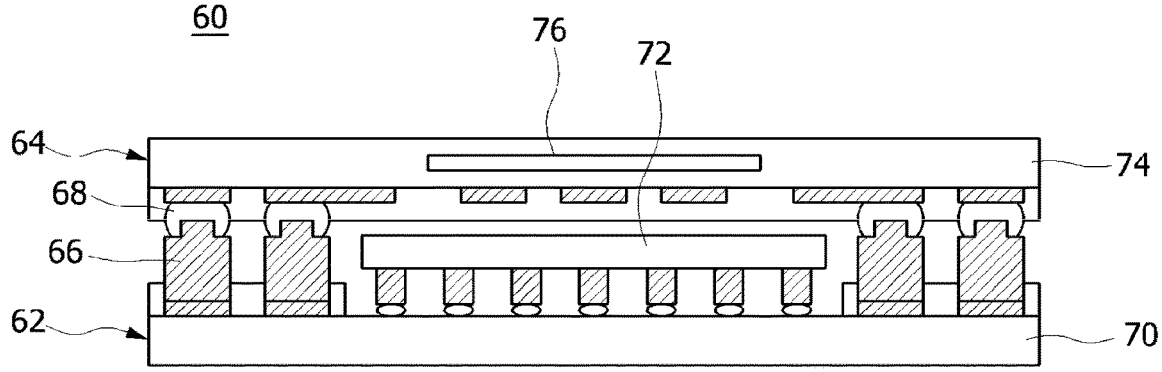
FIG. 2 is a cross-sectional view of a package-on-package (PoP) device in which upper and lower packaging dies are adhered to each other using a plurality of metal plugs, according to the related art.
Figure 3:
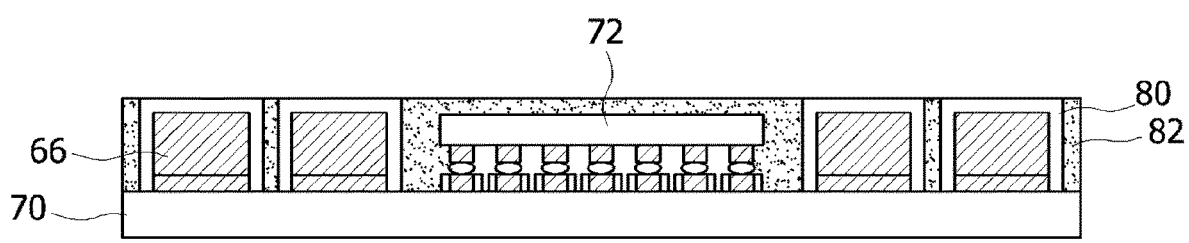
FIG. 3 is a cross-sectional view of a bottom packaging die further including a protective layer provided on a sidewall of a metal plug according to the related art.

Advantages and features of the present invention and methods of achieving the same will be clearly understood with reference to the following detailed embodiments. The present invention may, however, be embodied in many different forms and should not be construed as limited to the embodiments set forth herein. Rather, the embodiments are provided so that this disclosure will be thorough and complete, and will fully convey the scope of the present invention to those skilled in the art. The scope of the present invention is defined by the appended claims. In the drawings, the size and relative sizes of layers and regions may be exaggerated for clarity. Like numbers refer to like elements throughout the specification.

Furthermore, the embodiments of the present invention are described herein with reference to plan and/or cross-section illustrations that are schematic illustrations of the idealized embodiments of the present invention. Accordingly, for example, shapes of illustrated components may be modified as a result of manufacturing techniques and/or tolerances. Thus, the embodiments of the present invention are not to be construed as limited to the particular shapes of regions illustrated herein, but are to be understood as including deviations in shapes that result from manufacturing. Thus, the regions illustrated in the figures are schematic in nature and their shapes are not intended to illustrate the precise shape of a region of a device and are not intended to limit the scope of the present invention.

Hereinafter, a fan-out wafer-level package (C2FO-WLP) having the above-described configuration according to an exemplary embodiment of the present invention will be described in detail with reference to the accompanying drawings.

Figure 4:
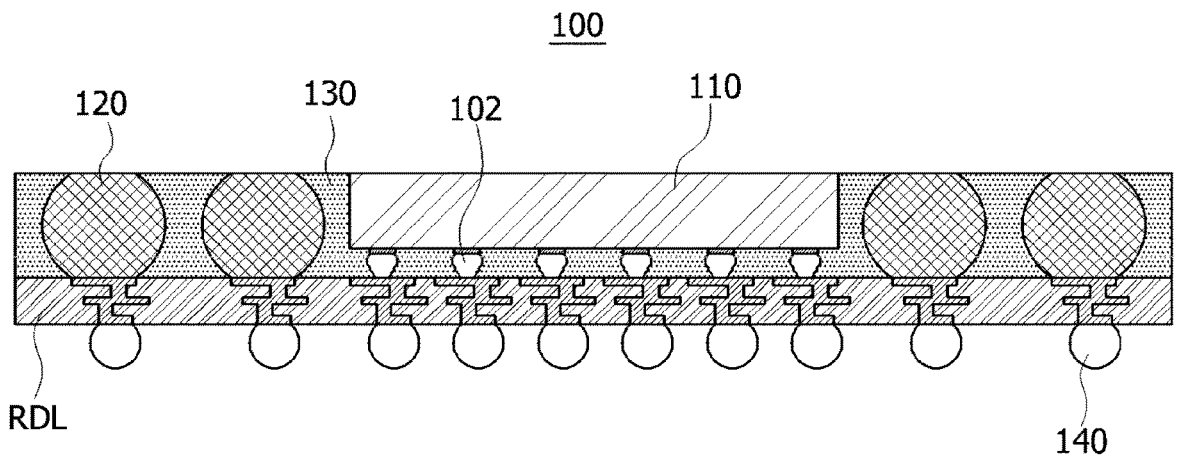
FIG. 4 is a cross-sectional view of a configuration of a fan-out wafer-level package including a metal core according to the present invention.

Referring to FIG. 4, a C2FO-WLP 100 of the present invention includes a redistribution layer RDL, a semiconductor chip 110 electrically connected to the redistribution layer RDL through stud contacts or bumps 102, interconnectors 120 disposed outside the semiconductor chip 110 to be substantially coplanar with the semiconductor chip 110 and having one side electrically connected to the outside through the redistribution layer RDL, a protective member 130 formed on the redistribution layer RDL, configured to protect the semiconductor chip 110 and the interconnector 120, and configured to expose the other side of the interconnector 120, and a connection member 140 of the redistribution layer RDL.

Here, the interconnector 120 may be formed using a ball mount process prior to an epoxy molding compound (EMC) process of the protective member 130. The conductive ball mount process includes forming a seed layer on a sacrificial substrate (refer to M in FIG. 11A), forming a sacrificial pad (refer to Mp in FIG. 11A) using an RDL process, and dropping a conductive ball on the sacrificial pad Mp.

Figure 5:
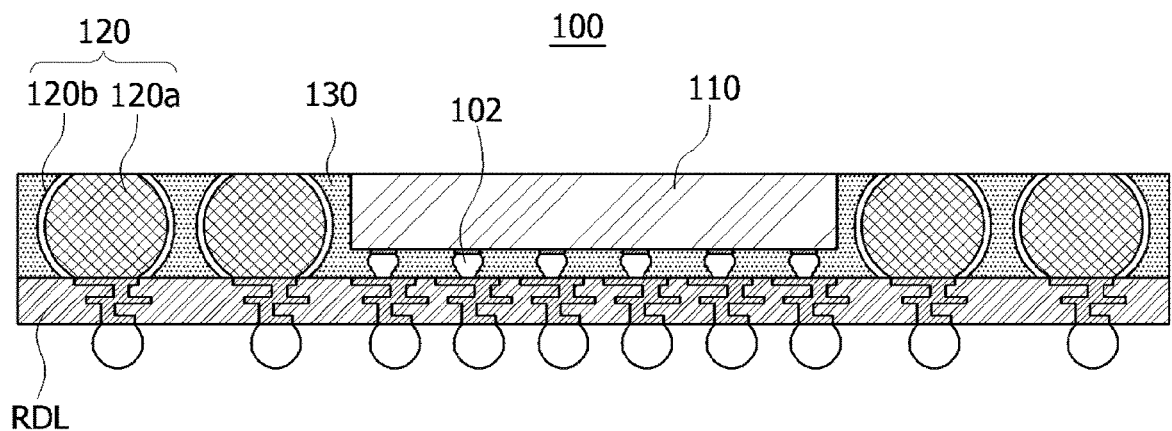
FIG. 5 is a cross-sectional view of a configuration of a fan-out wafer-level package further including a solder buffer according to the present invention.

Referring to FIG. 5, the interconnector 120 of the present invention is formed using the conductive ball. The conductive ball may include a metal-core solder ball.

The metal-core solder ball includes a metal core 120a located at the center thereof and a solder buffer 120b surrounding the metal core 120a.

The metal core 120a may solely include copper (Cu). Alternatively, the metal core 120a may include a combination of a central copper (Cu) portion and a silver (Ag) portion surrounding the central copper (Cu) portion. Alternatively, the metal core 120a may include a triple combination which further includes another metal portion outside the silver portion.

The solder buffer 120b may include lead (Pb) or tin (Sn), which has a relatively low melting point. The solder buffer 120b may include a nickel (Ni) alloy or a silver (Ag) alloy in addition to solder.

In particular, the metal-core solder ball is characterized by being formed by dropping a conductive ball according to a predetermined manual. The formation of the metal-core solder ball includes shaping a ball and dropping the ball on the sacrificial pad Mp.

When the metal-core solder ball has a double structure of the metal core 120a and the solder buffer 120b, the metal-core solder ball may improve conductive characteristics for interconnecting fan-out upper and lower packages and function as a buffer despite a difference in coefficient of thermal expansion (CTE) between the protective member 130 and the metal core 120a.

In addition, oxidation of the interconnector 120 may be suppressed due to the solder buffer 120b. Above all, the interconnector 120 may be protected from external impact.

The metal-core solder ball may have a globular shape, an egg shape, or a cubic shape. When the interconnector 120 is formed in a ball type, the interconnector 120 may be generally freely controlled, and adhesion of the redistribution layer RDL with the interconnector 120 may be increased during an RDL process. Particularly, since the redistribution layer RDL is formed using surface mount technology (SMT), processing costs are greatly reduced, and yield greatly increases.

The solder buffer 120b may include a multilayered structure of a conductive layer which is disposed inside thereof and formed of solder or nickel and a nonconductive layer which is disposed outside the conductive layer and formed of a material having a higher ductility than the conductive layer.

Figure 6:
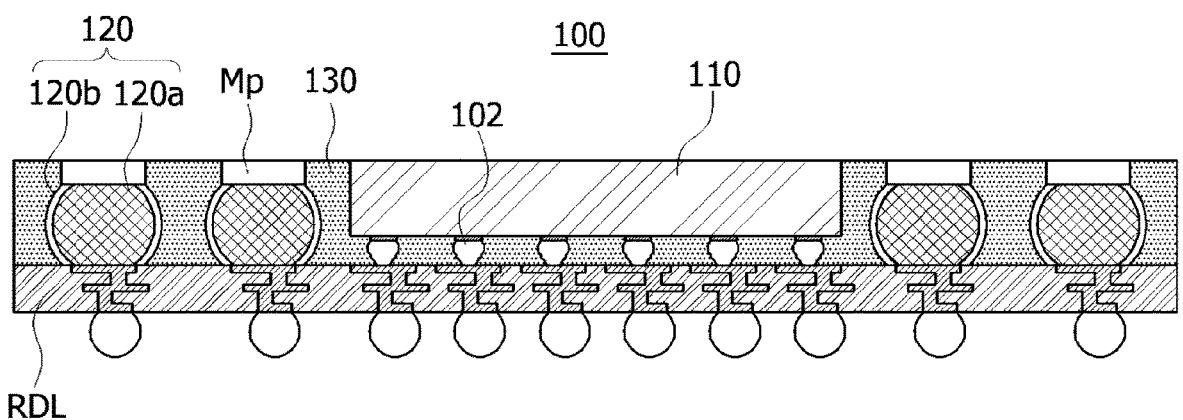
FIG. 6 is a cross-sectional view of a configuration of a fan-out wafer-level package further including a sacrificial pad according to the present invention.

Referring to FIG. 6, according to another aspect of the present invention, when the interconnector 120 is formed using the conductive ball, a size of the conductive ball may be easily changed according to conditions of each package because the conductive ball may be manufactured in various sizes by adjusting a diameter of the conductive ball.

For example, widths of packages tend to be gradually reduced due to a reduction in the design rule of semiconductor devices. When the overall width of a package is reduced, upper and lower sizes of an interconnector configured to connect upper and lower packages are meant to be reduced. The conductive ball of the present invention may actively adjust to size changes.

Although the size of the conductive ball may be freely changed, it is difficult to change a shape of the conductive ball. When the conductive ball is designed to have a small size corresponding to a fine pitch, the upper and lower packages may not wholly be connected to each other due to a limitation in shape change. For example, when a thickness of the package is reduced to correspond to the width of the package, durability of the package weakens. Thus, even in a case where the width of the package is reduced, a height of the package needs to be maintained. In this case, the height of the package may be maintained by variously designing a height of the sacrificial pad Mp.

For example, when the size of the conductive ball is reduced, the sacrificial pad Mp may be designed to have a relatively large height. The sacrificial pad Mp may be freely designed using an RDL process. When the sacrificial pad Mp is designed to stand high as described above, a partial height of some pads or the conductive ball may be supplemented even when the grinding process is performed.

In particular, an under-bump metallurgy (UBM) layer having an adhesion function or a protection function may be further formed on the sacrificial pad Mp and provide a reliable electrical and mechanical interface between the pad and the conductive ball.

Figure 7:
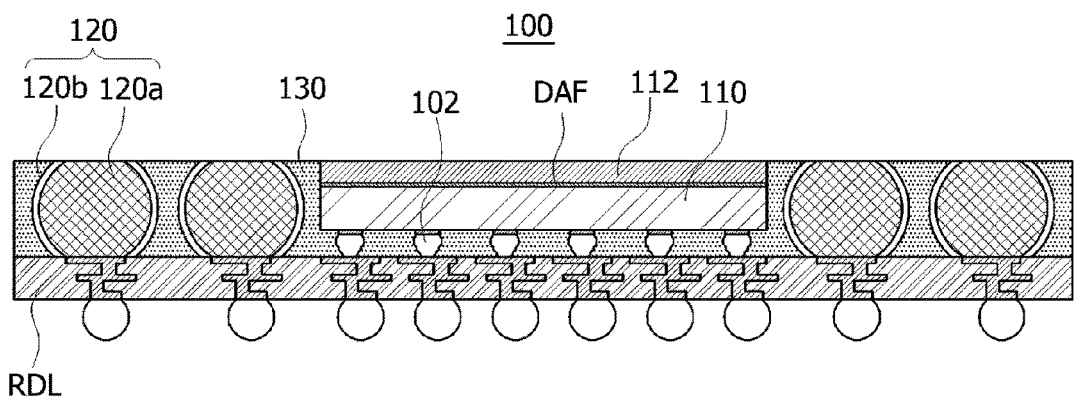
FIG. 7 is a cross-sectional view of a configuration of a fan-out wafer-level package further including a heat dissipation pad according to the present invention.

Referring to FIG. 7, a heat dissipation pad 112 may be further provided on a top surface of the semiconductor substrate 110. In another embodiment of the present invention, when the above-described sacrificial pad Mp is formed using an RDL process, the heat dissipation pad 112 may be also patterned. The heat dissipation pad 112 may be formed of the same material as the sacrificial pad Mp and have high thermal conductivity. Heat generated by the semiconductor chip 110 may be effectively dissipated by the heat dissipation pad 112.

The heat dissipation pad 112 may have a thickness greater than or equal to that of the sacrificial pad Mp. Particularly, according to the semiconductor C2FO-WLP of the present invention, the heat dissipation pad 112 is exposed by performing a thin-film process of partially removing a back side of the package using a grinding process to reduce a thickness of the package.

According to the embodiment of the present invention, the thickness of the semiconductor package is reduced using the above-described grinding process. When the heat dissipation pad 112 is not additionally provided, since the semiconductor chip 110 is directly exposed to the outside and not coated with an additional molding member, a normal warpage phenomenon is greatly reduced.

That is, since a back-side portion of the semiconductor chip 110 is directly exposed to the outside and dissipates heat while the molding member is not provided on the exposed portion of the semiconductor chip 110, a double effect of suppressing a warpage phenomenon due to a CTE difference may be expected.

Figure 8:
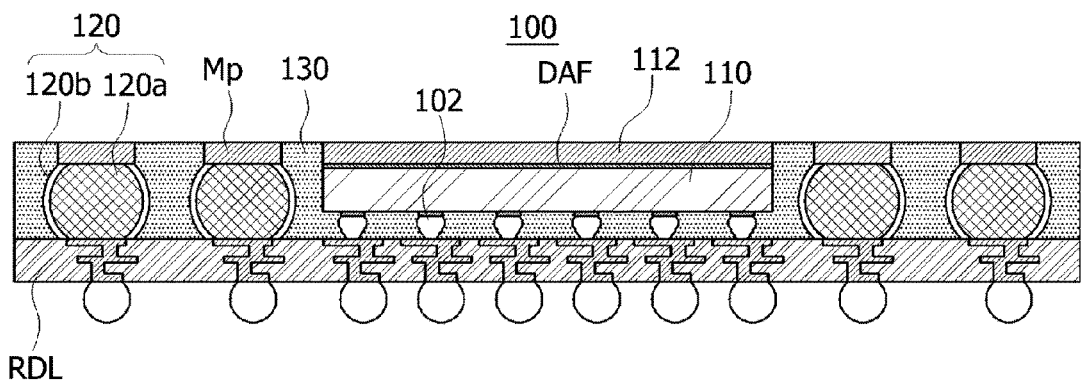
FIG. 8 is a cross-sectional view of a configuration of a fan-out wafer-level package including both a sacrificial pad and a heat dissipation pad according to the present invention.

Referring to FIG. 8, a redistribution layer RDL may be formed on the sacrificial substrate M using an RDL process, and various patterning processes for adjusting a height of the sacrificial pad Mp may be performed along with a process of patterning the heat dissipation pad 112. Thus, a thickness of the entire package may be reduced, and the patterning process may be greatly shortened.

Accordingly, a C2FO-WLP 100 according to another embodiment of the present invention may include a redistribution layer RDL, a semiconductor chip 110 having a first surface (or bottom surface) electrically connected to the redistribution layer RDL through stud contacts or bumps 102, a protective member 130 configured to protect side surfaces of the semiconductor chip 110, a heat dissipation pad 112 adhered to a second surface (or top surface) of the semiconductor chip 110, sacrificial pads Mp configured to be substantially coplanar with the heat dissipation pad 112, and interconnectors disposed outside the semiconductor chip 110. A lower portion of the interconnector may be connected to the redistribution layer RDL, and an upper portion of the interconnector may be connected to the sacrificial pad Mp.

Although the heat dissipation pad 112 is formed of the same material using the same process as that of the sacrificial pad Mp, the heat dissipation pad 112 may be formed to a thickness greater than or equal to a thickness of the sacrificial pad Mp.

Figure 9:
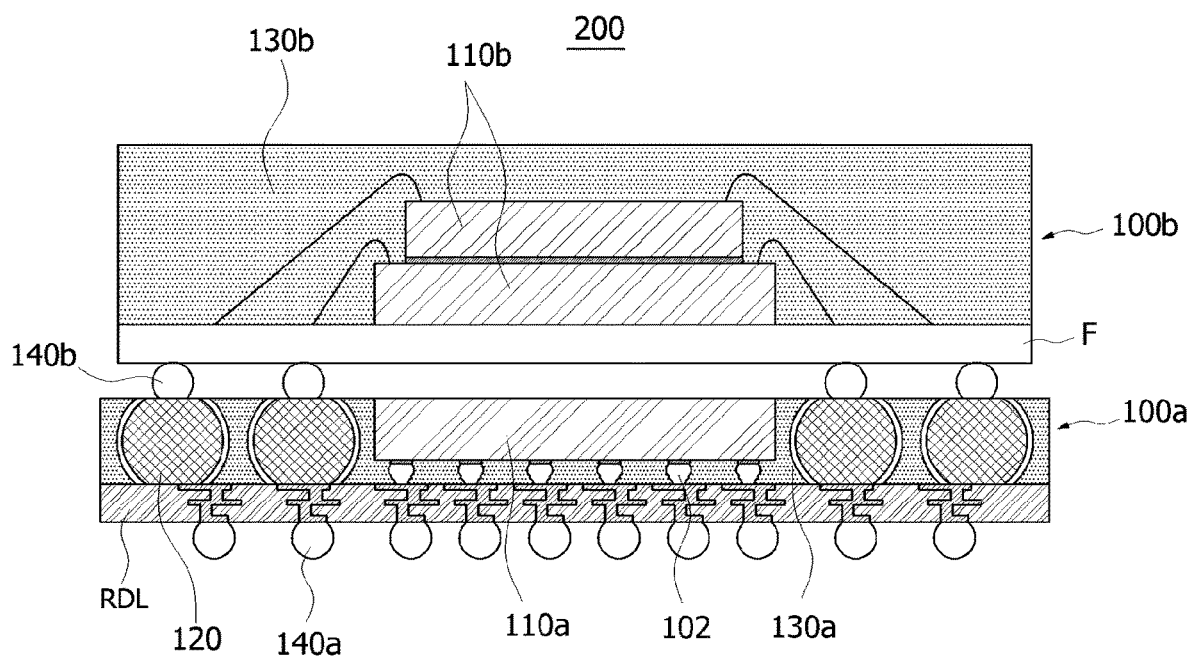
FIG. 9 is a cross-sectional view of a configuration of a fan-out PoP in which upper and lower packages are connected to each other by interconnectors, according to the present invention.

Referring to FIG. 9, a fan-out POP package 200 of the present invention is a package-on-package (PoP) type in which one-side package is stacked on another-side package. The PoP package 200 includes a fan-out lower package 100a, a fan-out upper package 100b, and upper/lower interconnectors 120 provided outside the lower package 100a and configured to connect a pair of packages 100a and 100b.

The present invention is characterized in that an interconnector 120 is not formed using a via process. The interconnector 120 of the present invention may be formed using a metal-core solder ball process.

The lower package 100a includes a redistribution layer RDL, a lower semiconductor chip 110a adhered to the redistribution layer RDL on the redistribution layer RDL through stud contacts or bumps 102, a lower protective member 130a configured to protect the lower semiconductor chip 110a, and a lower connection member 140a.

The upper package 100b may include an upper substrate F, at least one upper semiconductor chip 110b wire-bonded to the upper connection member 140b, and an upper protective member 130b configured to protect the upper semiconductor chip 110b. The upper connection member 140b may be directly connected to the interconnector 120.

The lower semiconductor chip 100a may include a logic semiconductor, and the upper semiconductor chip 100b may include a memory semiconductor.

As described above, the interconnector 120 for connecting upper and lower packages according to the present invention is formed during a process for the lower package 100a.

Meanwhile, the lower semiconductor chip 110a may be electrically connected to the redistribution layer RDL by the stud contacts or bumps 102. The stud contact or bump 102 may be formed using a stud bump process, a copper (Cu) (or another metal) filter process, or a solder ball process.

Hereinafter, a method of manufacturing a fan-out PoP according to the present invention will be described with reference to the accompanying drawings.

Figure 10A:
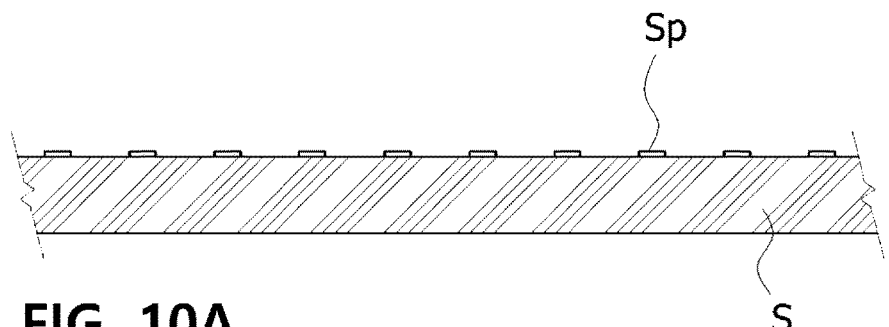
FIGS. 10A to 10D are cross-sectional views illustrating a process of manufacturing a semiconductor chip according to the present invention.

A process of manufacturing a semiconductor chip will be described with reference to FIGS. 12 and 10A to 10D:

Preparing a semiconductor substrate (S10);

Referring to FIG. 10A, a semiconductor substrate S is provided. In this case, the semiconductor substrate S includes a strip-type wafer. A semiconductor pad Sp (or a wafer pad) is formed on one surface of the semiconductor substrate S (or referred to as a wafer). The pad Sp may be formed using an RDL process.

Figure 10B:
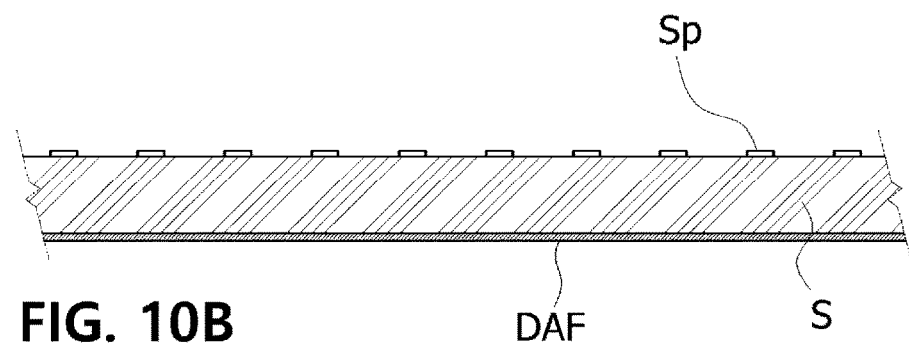

Laminating an adhesive tape on one surface of the semiconductor substrate (S12);

Referring to FIG. 10B, the semiconductor substrate S is coated with a die-attached film (DAF) or another adhesive tape by a predetermined thickness and laminated on one surface thereof.

Figure 10C:
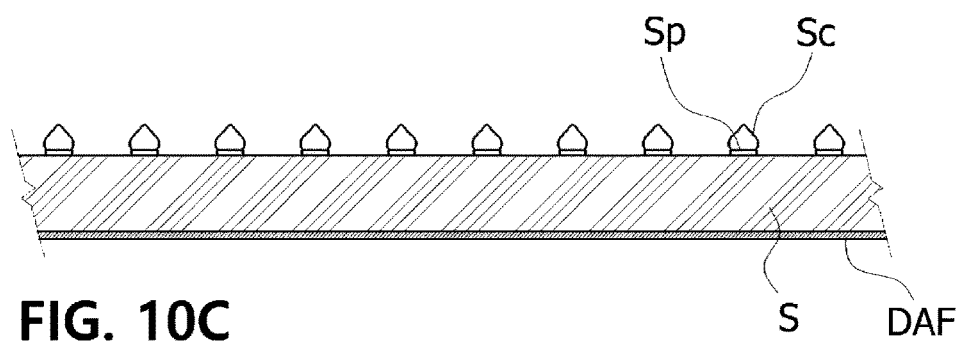

Bonding a contact metal to a semiconductor pad (S14);

Referring to FIG. 10C, a contact metal Sc is formed on the semiconductor pad Sp using a metal stud bump bonding process or a solder ball process. The contact metal Sc undergoes an exposure process described below to form stud contacts or bumps 102.

Figure 10D:
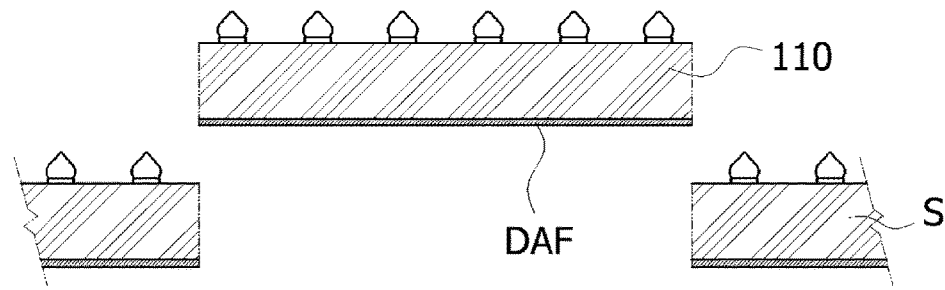

Separating the semiconductor substrate into individual semiconductor chips (S16);

Referring to FIG. 10D, a process of separating the semiconductor substrate S into individual semiconductor chips 110 using a singulation process may be performed. Thus, the individual semiconductor chip (refer to 110 in FIG. 4) to which the contact metal Sc is bonded is provided on the semiconductor pad Sp.

Figure 11A:
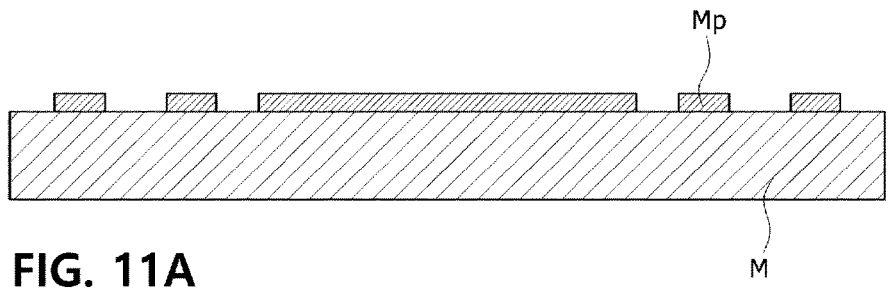
FIGS. 11A to 11G are cross-sectional views of a process of manufacturing a fan-out package according to the present invention.

A process of manufacturing a fan-out package will be described with reference to FIGS. 12 and 11A to 11G:

Preparing a sacrificial substrate (S20);

Referring to FIG. 11A, a sacrificial substrate M may include a mirror wafer. The sacrificial substrate M is provided and a sacrificial pad Mp is formed on one surface of the sacrificial substrate M. The sacrificial pad Mp may be formed using an RDL process. Since a package process of the present invention includes forming the semiconductor chip on the sacrificial substrate M, a warpage phenomenon caused by thermal expansion may be minimized during a high-temperature process.

Meanwhile, according to the embodiment of the present invention, when the pad Mp is formed on the sacrificial substrate M, a seed may be formed on the sacrificial substrate M corresponding to the pad Mp, and the pad Mp may be formed using the seed.

Figure 11B:
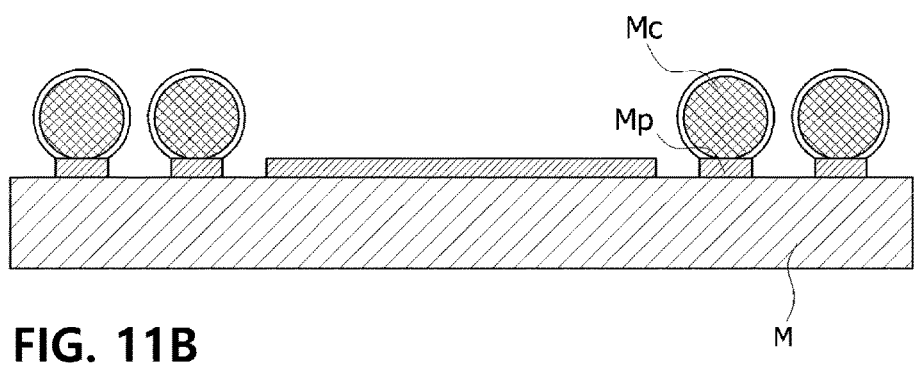

B bonding an interconnector metal to the sacrificial pad on the sacrificial pad (S22);

Referring to FIG. 11B, an interconnector metal Mc is formed on the sacrificial pad Mp using a solder ball process or a metal post process. The interconnector metal Mc undergoes a solder ball process described below to form an upper-lower interconnector (refer to 120 in FIG. 4), which replaces a via forming process and a via filling process.

Figure 11C:
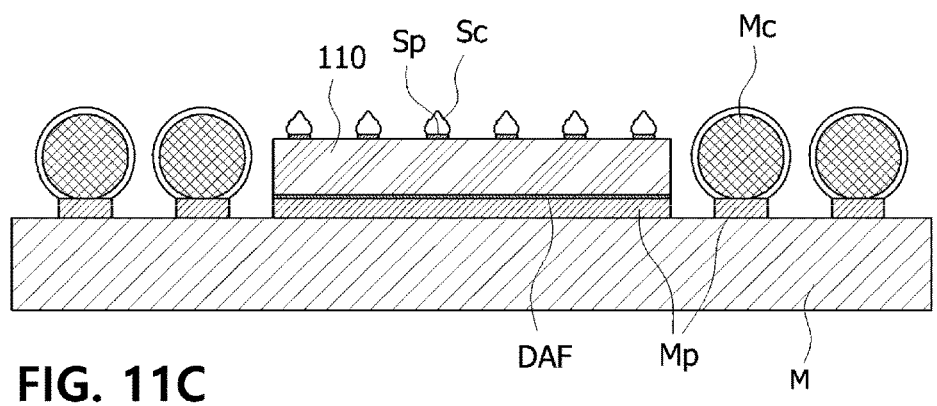

Mounting an individual semiconductor chip including the contact metal provided on the semiconductor pad, in a face-up form on the sacrificial substrate including the interconnector metal provided on the sacrificial pad (S30);

Referring to FIG. 11C, each semiconductor chip 110 may be fixed on the sacrificial substrate M using an adhesive tape (e.g., DAF). In this case, the semiconductor chip 110 fixed on the sacrificial substrate M by the adhesive tape (e.g., DAF) may be fixed without being moved during a molding process or a planarization process described below. Thus, a reduction in yield may be minimized during an RDL process described below.

Figure 11D:
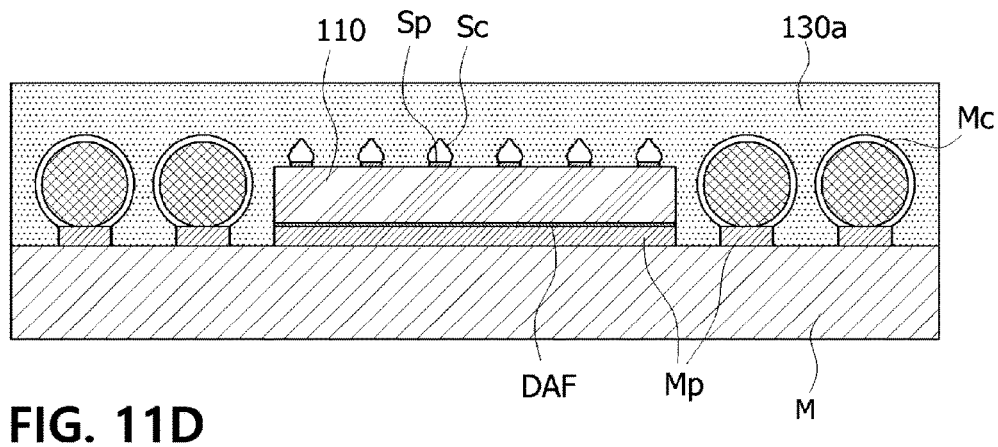

Molding a protective member on the sacrificial substrate (S32);

Referring to FIG. 11D, an epoxy molding compound (EMC) is deposited on the contact metal Sc bonded to the semiconductor pad Sp and the interconnector metal Mc bonded to the sacrificial pad Mp. The EMC may be coated with a protective member 130 to cover the contact metal Sc and the interconnector metal Mc.

Figure 11E:
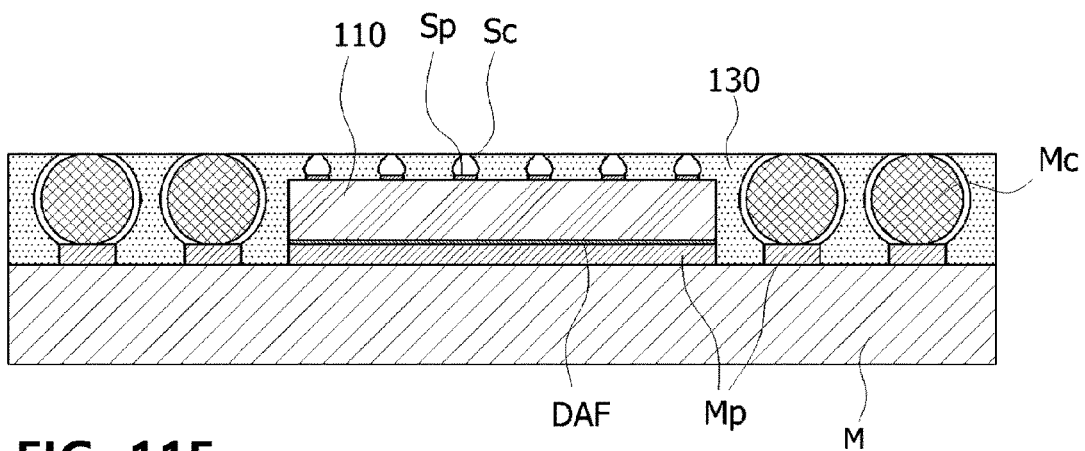

Grinding and planarizing the protective member (S34);

Referring to FIG. 11E, a planarization process is continuously performed until the contact metal Sc and the interconnector metal Mc are exposed. As a result, the contact metal Sc and the interconnector metal Mc, which are exposed using the planarization process, form the stud contacts or bumps (refer to 102 in FIG. 4) and the interconnectors (refer to 120 in FIG. 4).

Figure 11F:
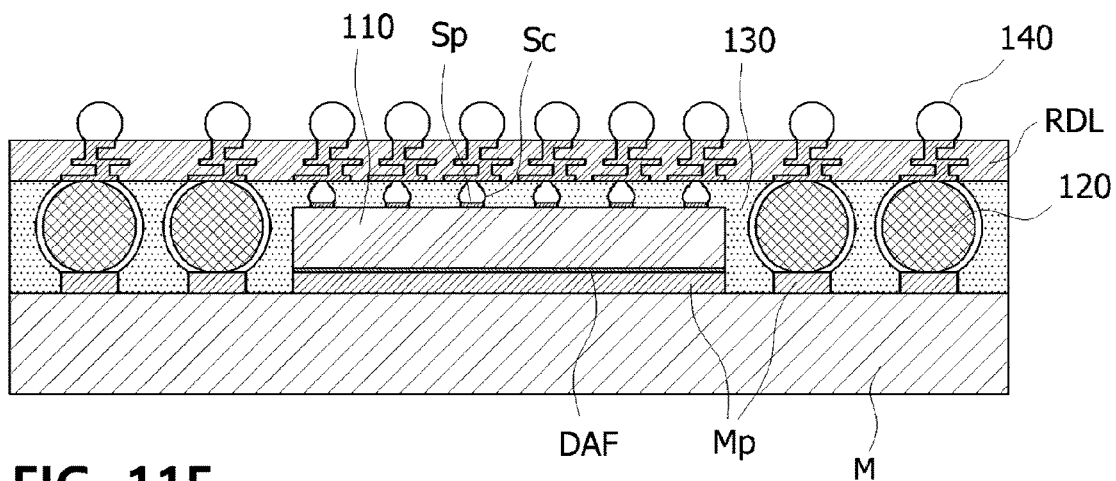

Redistribution for electrically connecting the bump and the interconnector to the outside (S40);

Referring to FIG. 11F, as a result of a top-side RDL process, a redistribution layer RDL is formed to electrically connect another package (refer to 100b in FIG. 9) to the outside through the interconnectors 120 and electrically connect the semiconductor chip (refer to 100a in FIG. 9) to the outside through the stud contacts or bumps 102. Further, a redistribution connection member 140 is formed.

Figure 11G:
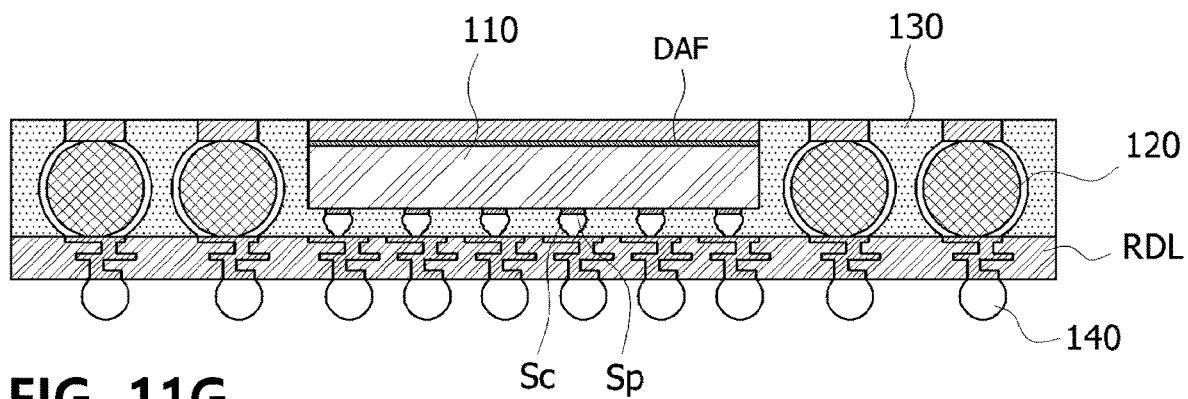
Figure 12:
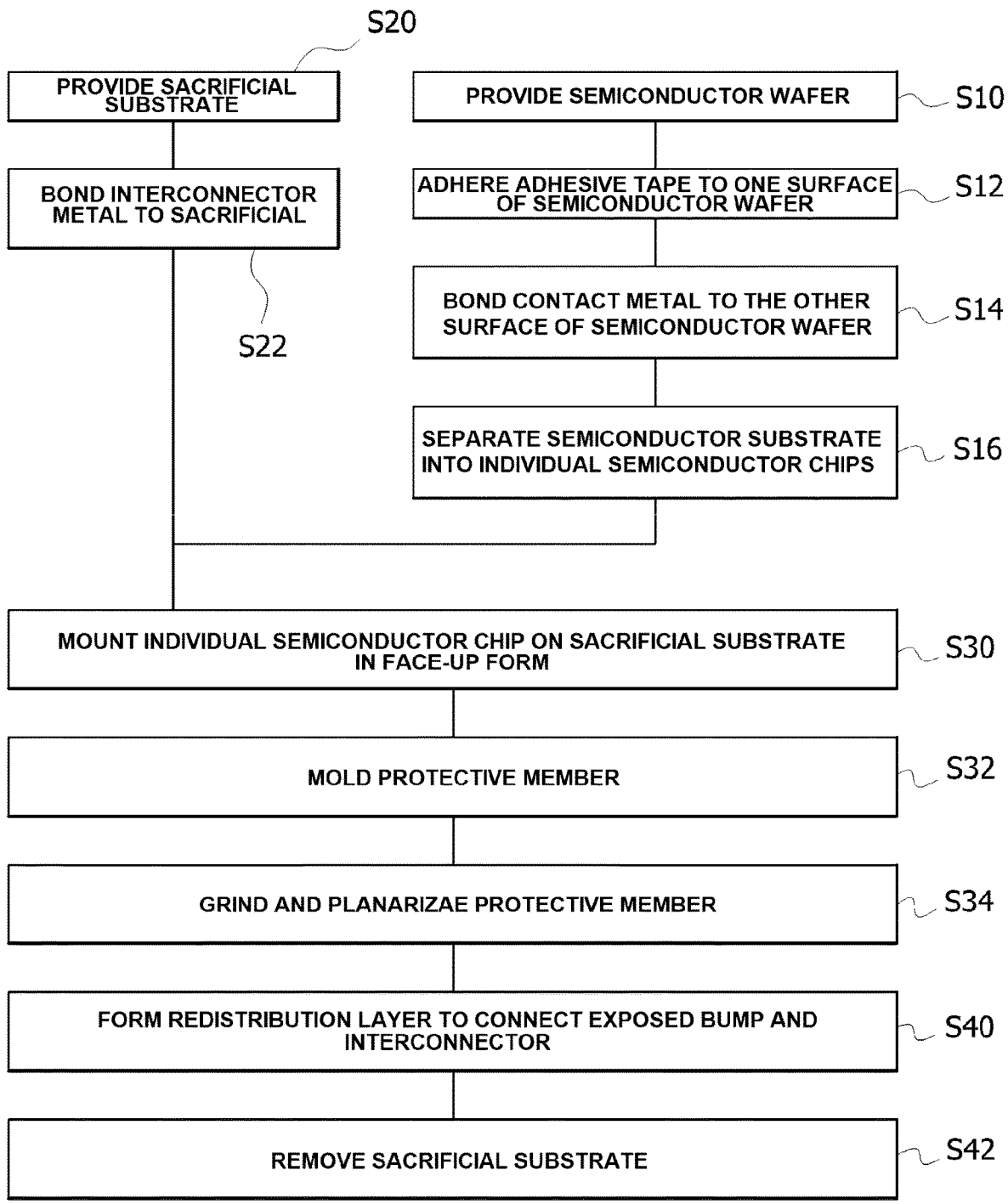
FIG. 12 is a flowchart of a process of manufacturing a fan-out package according to the present invention.

Removing the sacrificial substrate from the semiconductor chip (S42);

Referring to FIG. 11G, the sacrificial substrate M is ground to remove the sacrificial substrate M from the protective member 130. Portions of the sacrificial pad Mp and the heat dissipation pad 112 are removed using a grinding process. Thus, the semiconductor chip 110 and the sacrificial pad Mp are exposed and electrically connected to another package (refer to 100b in FIG. 9).

In this case, when the sacrificial substrate M is removed, the sacrificial pad Mp may remain to be as thick as a thickness of the heat dissipation pad 112. However, since the thickness of the heat dissipation pad 112 is greater than a thickness of the sacrificial pad Mp, the sacrificial pad Mp may be wholly removed, and only the heat dissipation pad 112 may remain.

As described above, it can be seen that the present invention provides a fan-out PoP in which interconnectors configured to connect upper and lower packages are formed using conductive balls, and a metal-core solder ball process is used without using a via forming process and a via filling process after molding the conductive ball. It will be understood by one of ordinary skill in the art that various other changes may be made within the spirit and scope of the present invention.

The invention claimed is:
1. A fan-out wafer-level package comprising:
a redistribution layer;

a semiconductor chip electrically connected to the redistribution layer through a bump;

a protective member configured to protect the semiconductor chip; and an interconnector disposed outside the semiconductor chip at substantially the same level as the semiconductor chip, wherein a lower portion of the interconnector is electrically connected to the redistribution layer and a top surface of the interconnector, a top surface of the protective member, and a top surface of the semiconductor chip are positioned to form a substantially uniform planar surface, wherein the interconnector comprises a metal-core solder ball, the metal-core solder ball comprises a metal core and a solder buffer interposed between the metal core and the protective member, an upper portion of the metal-core solder ball comprises a surface of the metal core not covered by the solder buffer, and the metal core comprises a combination of copper (Cu), nickel (Ni), or silver (Ag).

2. The fan-out wafer-level package of claim 1, wherein the interconnector has one of a globular shape or an egg shape.

3. The fan-out wafer-level package of claim 2, wherein the solder buffer is formed of a material having a higher ductility than a metal material of the metal core and includes tin (Sn) solder.

4. The fan-out wafer-level package of claim 2, wherein the solder buffer includes a multilayered structure of solder and nickel (Ni) (or nickel alloy) layers.

5. The fan-out wafer-level package of claim 1, wherein the solder buffer includes a multilayered structure of a conductive layer which is disposed inside thereof and formed of solder or nickel and a nonconductive layer which is disposed outside the conductive layer and formed of a material having a higher ductility than the conductive layer.

6. The fan-out wafer-level package of claim 1, wherein the bump is a stud bump having a pointed end portion.

* * * * *